US005509117A

United States Patent [19]

Haug

[11] Patent Number: 5,509,117

[45] Date of Patent: Apr. 16, 1996

[54] FRANKING MACHINE

[75] Inventor: Werner Haug, Langnau, Switzerland

[73] Assignee: Frama AG, Lauperswil, Switzerland

[21] Appl. No.: 26,994

[22] Filed: Mar. 5, 1993

[30] Foreign Application Priority Data

Mar. 10, 1992 [CH] Switzerland .......................... 00754/92

[51] Int. Cl.[6] .......................... G01R 31/28; G06F 11/00

[52] U.S. Cl. .............................. 395/182.08; 364/464.02

[58] Field of Search .............................. 395/575, 182.08; 371/57.1; 364/464.02, 464.03, 918.52

[56] References Cited

U.S. PATENT DOCUMENTS

| | | | |
|---|---|---|---|
| 4,421,977 | 12/1983 | Kittredge | 235/101 |
| 4,481,604 | 11/1984 | Gilham | 364/900 |
| 4,757,532 | 7/1988 | Gilham | 380/23 |
| 4,837,714 | 6/1989 | Brookner et al. | 364/464.02 |
| 4,853,523 | 8/1989 | Talmadge | 364/464.02 |
| 5,029,093 | 7/1991 | Wiener | 364/464.02 |
| 5,109,507 | 4/1992 | Check, Jr. | 395/575 |
| 5,121,432 | 6/1992 | Gilham et al. | 364/464.02 |
| 5,157,616 | 10/1992 | Haug | 364/464.02 |
| 5,200,903 | 4/1993 | Gilham | 364/464.02 |
| 5,307,280 | 4/1994 | Haug | 364/464.02 |

*Primary Examiner*—Robert W. Beausoliel, Jr.
*Assistant Examiner*—Glenn Snyder
*Attorney, Agent, or Firm*—Ladas & Parry

[57] ABSTRACT

The memory (RAM) of an electronically controlled franking machine containing data corresponding to postal value amounts is enclosed, together with a microprossor (CPU) on a mounting board in a lead-sealed casing. In the event of a defect of an element enclosed in such casing, the complete assembly unit comprising the mounting board and the casing is replaced. In order to be able to subsequently transfer in tamper-proof manner, the data from the memory to that of the new assembly unit, in a transceiver bus between the memory and the CPU, there are two plug units. One of these plug units is closed by a connector unit, so that during the operation of the franking machine the data flow is looped through the connector unit. A writing line, provided in addition to the transceiver bus, is used for reading in the working data during franking, so that it is not accessible via any plug unit. For the transfer of the data, the plug unit of the defective assembly unit, following the removal of the connector unit, is connected to the plug unit of the replaced, new assembly unit.

6 Claims, 9 Drawing Sheets

FRANKING MACHINE

BACKGROUND OF THE INVENTION

The invention relates to a franking machine with at least one electronic computer (CPU), which is connected to at least one data memory (RAM) for postal data containing value amounts.

In the case of franking machines of this type it is standard practice to lead-seal the outer machine casing to ensure that interventions within the machine can only be carried out by an authorized person. However, it has been found that this does not exclude misuse, and considerable value losses caused by falsifying access to the memory are possible.

SUMMARY OF THE INVENTION

The problem of the invention is to obviate the aforementioned disadvantage and provide a franking machine which prevents access to the memory containing value amounts when repairs are being performed. According to the invention, this problem is solved in that the CPU and the RAM are mounted on a common assembly unit and enclosed in a sealed casing part.

As a result of the invention, in the case of a faulty CPU or RAM, replacement thereof must occur. This is easily possible, because they are located on a common assembly unit, so that they can be replaced, together with the assembly unit and the sealed casing. For repair work not affecting the electronics, it is consequently possible to open the machine casing, without any access to the electronic components being possible.

Known franking machines of the aforementioned type suffer from the further disadvantage that in the case of a defect on the electronic computer system of the franking machine, the value amount-corresponding data of the memory can no longer be read out. This disadvantage is obviated by a preferred embodiment of the invention, so that in the case of a defect on the computer system of the franking machine, the rightful data content is secured, and after repair can be accepted in a reliable manner. For this purpose, the CPU is connected to the RAM by means of a writing line for reading in operating data, as well as a data transmission line or bus receiver, and the latter has a first and a second plug unit, which are located on the assembly part outside the sealed casing part, the first being open, whereas the second is located in a plug connection with a connector unit, so that data transmission across the connector unit is looped.

Another embodiment of the invention ensures that data transfer from the memory of the defective assembly unit can only be performed once. For this purpose mechanical locking means are provided, which are in operative connection with a switch setting and electronic flag. The flag is set on removing the defective assembly unit. A second, unerasable flag is set on transferring the data to the assembly unit, so that the defective assembly unit is no longer suitable for a second data transfer.

In addition, a data safeguarding method is proposed, which is characterized by the replacement of the old assembly part carrying the defective computer system by an identical, new assembly part with corresponding identical, electronic elements enclosed in a lead-sealed casing unit, removing the looping connector unit of the old assembly unit, producing a plug connection between the second plug unit of the old assembly part and the first plug unit of the new assembly part, transfer of the data content of the old memory to the new memory via the plug connection formed, and removal of the old assembly part with the old memory.

DESCRIPTION OF THE DRAWINGS

The invention is described in greater detail herein after relative to the drawings, wherein show.

DETAILED DESCRIPTION OF PREFERRED EMBODIMENTS

Figure 1:
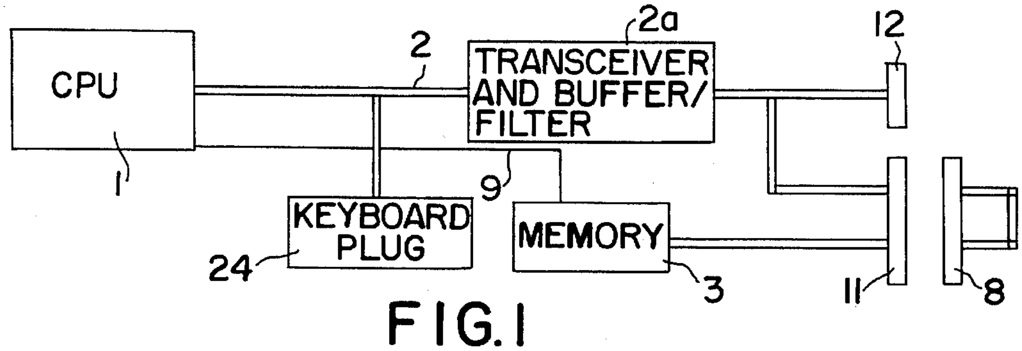
FIG. 1 A block diagram with the franking machine parts essential to the invention.
Figure 2:
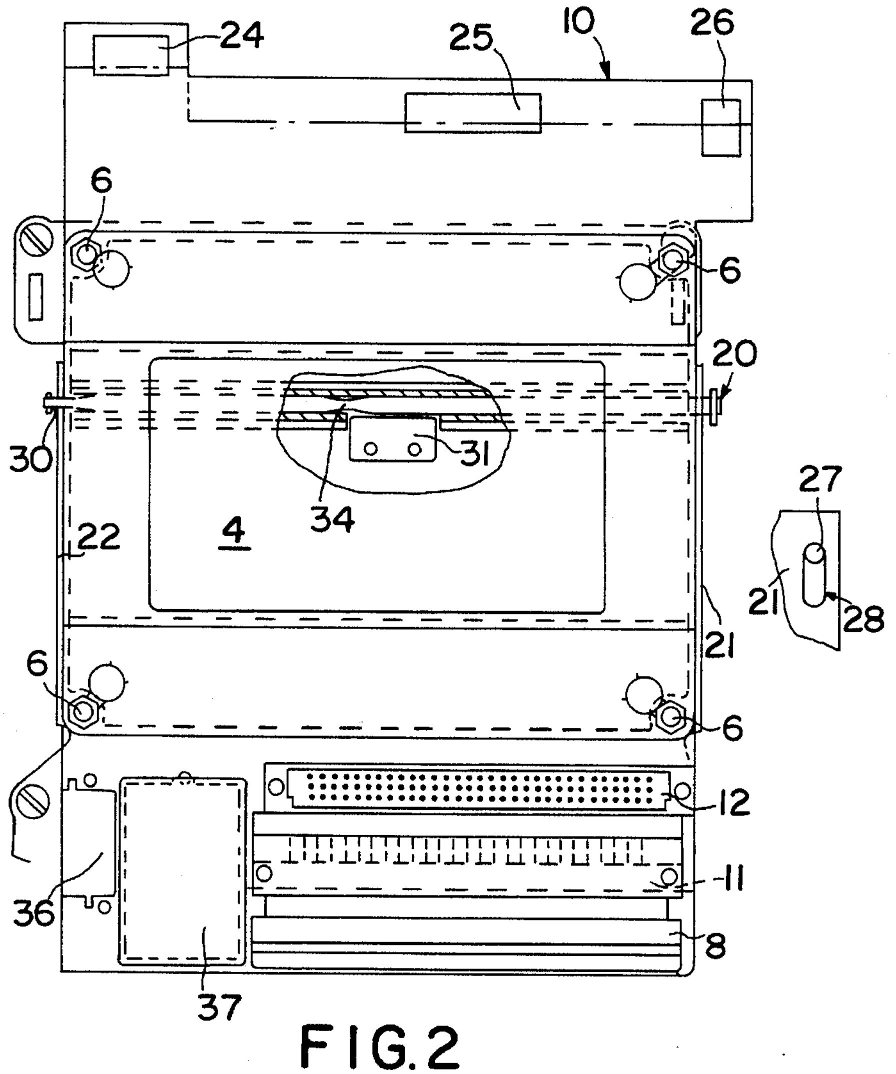
FIG. 2 An incomplete plan view of an assembly unit enclosing electronic components.
Figure 3:
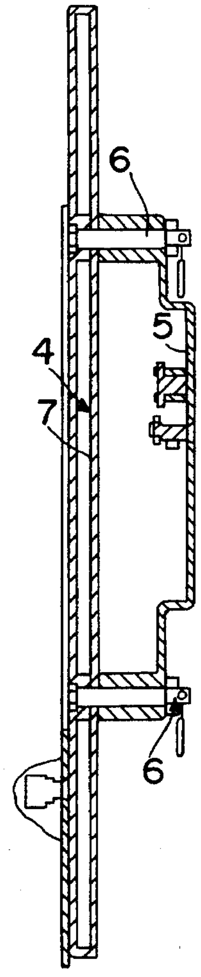
FIG. 3 A cross-section through the assembly unit according to FIG. 2 along a connecting line between the lead-sealed locking screws, without electronic components.
Figure 5:
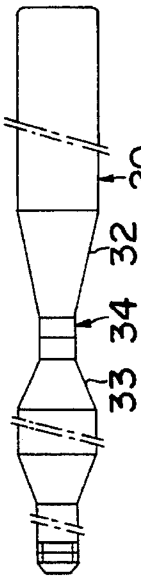
FIG. 5 A shortened representation of the locking bolt.
Figure 6:
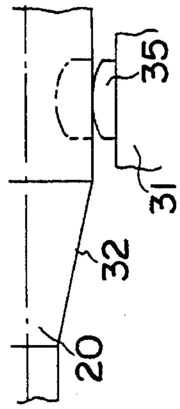
FIG. 6 A larger-scale representation of Part of a locking bolt, with attached signal switch.
Figure 4:
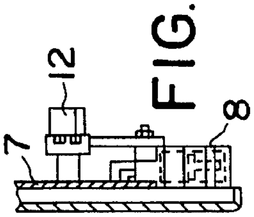
FIG. 4 Part of the assembly unit according to FIG. 2 in the vicinity of the looping plug and in part sectional side view.
Figure 8:
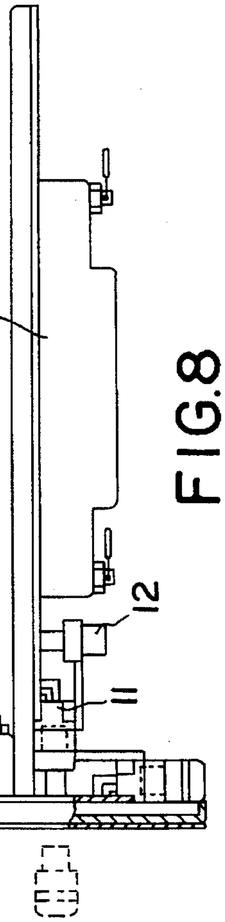
FIG. 8 A side view of the two, coupled together assembly units according to FIG. 7.
Figure 8:
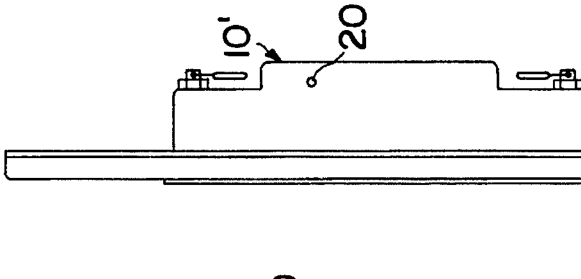
Figure 7:
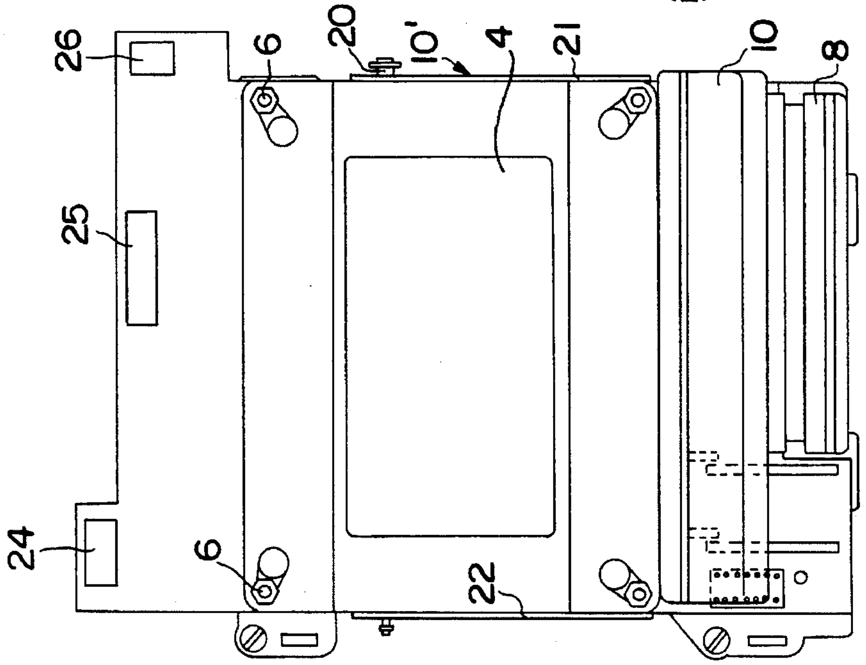
FIG. 7 A representation of a new assembly unit corresponding to FIG. 2 with a coupled, old assembly unit.

The construction and operation of the electronic franking machine can e.g. be in accordance with U.S. Pat. No. 4,520,725 (EP-A-0 105 424), U.S. Pat. No. 4,898,093 (EP-A-0 222 275), U.S. Pat. No. 4,788,623 (EP-A-0 214 410), U.S. Ser. No. 07/490,037 (EP-A-0 386 390), U.S. Ser. No. 07/490,040 (EP-A-0 387 202), U.S. Ser. No. 07/499,604 (EP-A-0 390 731), and it is consequently unnecessary to once again describe the details which are not essential for the purposes of the present invention. Correspondingly, the franking machine has at least one computer unit (CPU) 1 and several data memories (RAM, PROM), which are interconnected by means of a data transfer line or transceiver bus 2. The present invention deals with measures intended to ensure that the variable memories cannot be modified through access from the outside, e.g. during repairs and that in the case of damage to electronic components their content is not lost.

Particular significance is attached in this connection to the non-volatile, variable memory 3 (NOVRAM) for the stored value amounts required for franking and correspondingly for the consumed value amounts. A reloading of said value amount is possible by means of a coded, e.g. telephonic or written, data exchange with the post office (EP-A-390 731 or U.S. Ser. No. 07/499,604).

The non-volatile, battery-assisted memory 3 (NOVRAM) can be subdivided into different contents, i.e. the total amount of all the franking operations which have taken place and for different user accounts, which are in turn subdivided into different subaccounts, which can be loaded, as required, by the franking machine user during franking.

The allocation to one of the different user accounts takes place by means of an identification key, e.g. in accordance with the aforementioned U.S. Pat. No. 4,788,623 (EP-A-214 410).

In order that the memory 3 cannot be replaced in an unauthorized manner, it, together with the CPU 1, is enclosed in a casing part 4, whose flat cover 5 is fixed by four lead-sealed screws 6 to the mounting board 7. In addition, the at least one memory 3 is not connected by a plug-socket arrangement to the electronic mounting board 7. Thus, an interchange is avoided, because, otherwise, on interchanging, by accident or by falsification, the data contained therein could be changed. The connection of the memory 3 to the CPU allowing data traffic, e.g. interrogation of the remaining value amount, etc., takes place by means of a connector unit 8 located in the transceiver bus 2 and in which the data transmission is looped. The transceiver bus 2*a* forms an amplifier, which can be switched on and off and enables the direction to be reversed. It also fulfills buffer functions for unblocking faults and acts as a data filter, in that it only allows the passage of data in a specific direction, which e.g. following the replacement of the assembly unit 10, are to be transmitted from the old assembly unit 10 or from its memory 3.

In addition to the transceiver bus 2*a* there is an independent writing line 9 by means of which data can be read into the memory 3, so that the data content changes. As this writing line is not looped across the transceiver bus 2, the memory cannot be modified from outside the lead-sealed casing part 4. In the dead or standby mode of the CPU, the writing line 9 is switched in such a way that data can only be read out of the memory 3.

Figure 9:
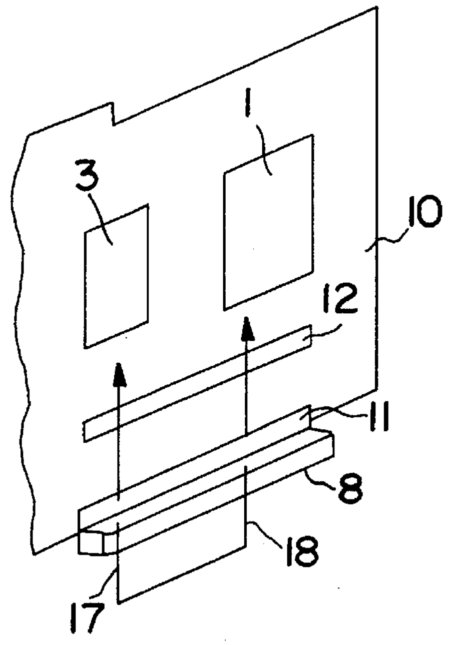
FIG. 9 A diagrammatic perspective view of an assembly unit with electronic components and its data flow.
Figure 10:
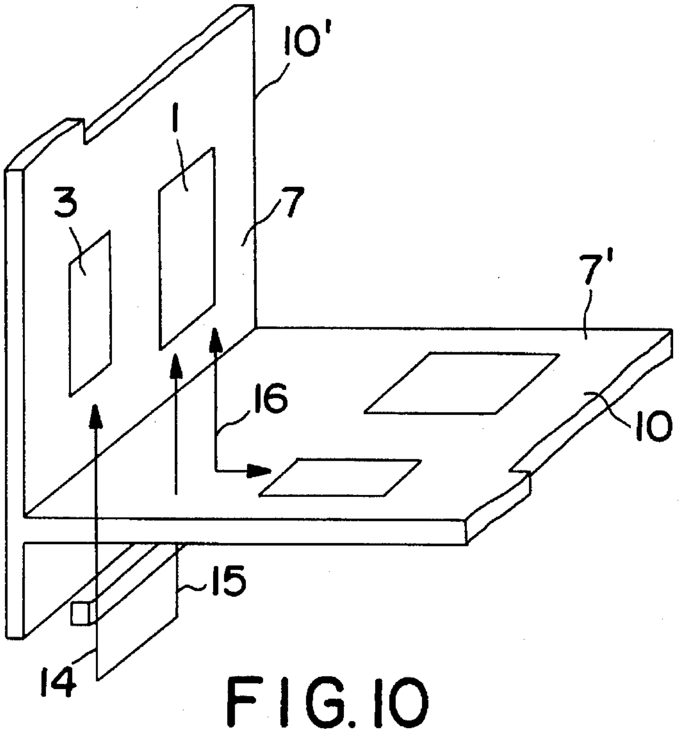
FIG. 10 A representation corresponding to FIG. 9 of a new assembly unit with coupled, old assembly unit indicating the data flow on data transfer.
Figure 11A:
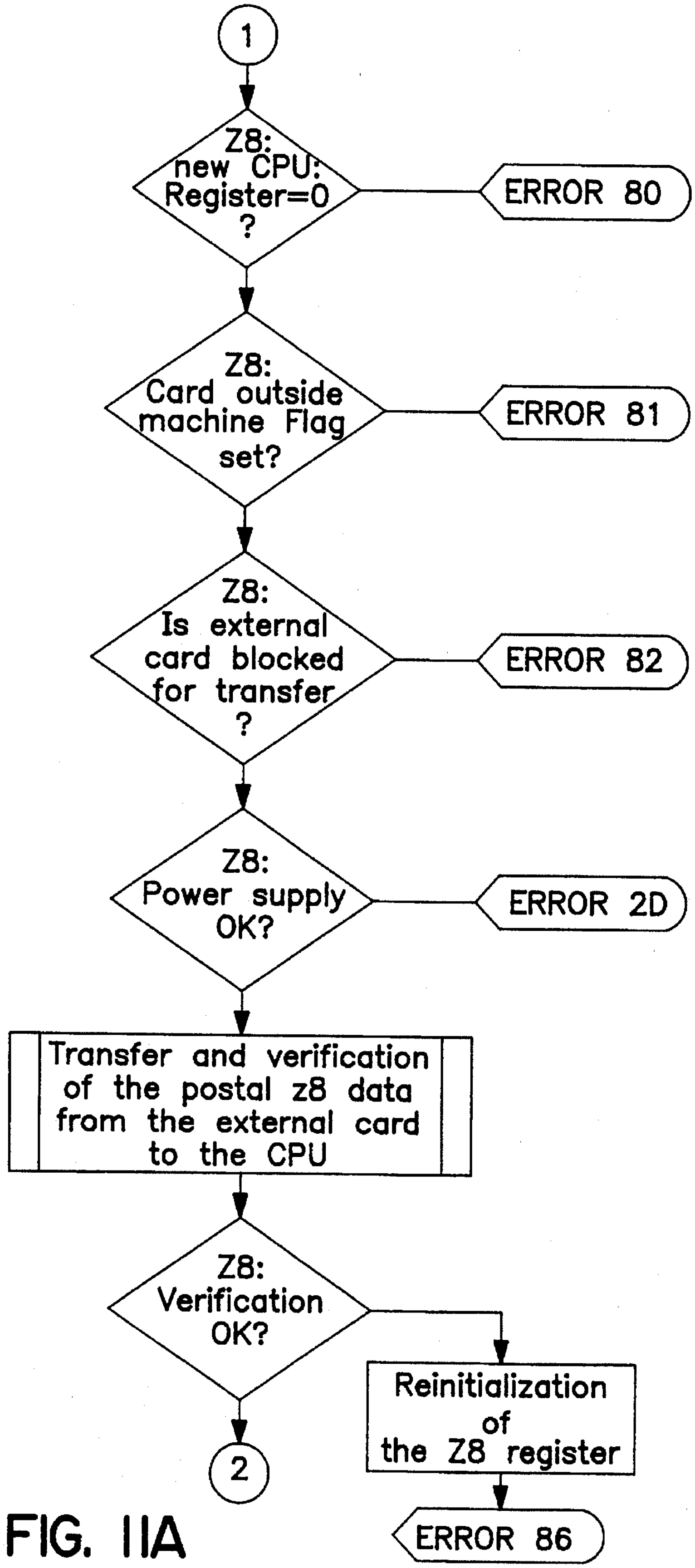
FIG. 11 A–F Programme sequence plans for the data transfer from the old to the new assembly unit.
Figure 11B:
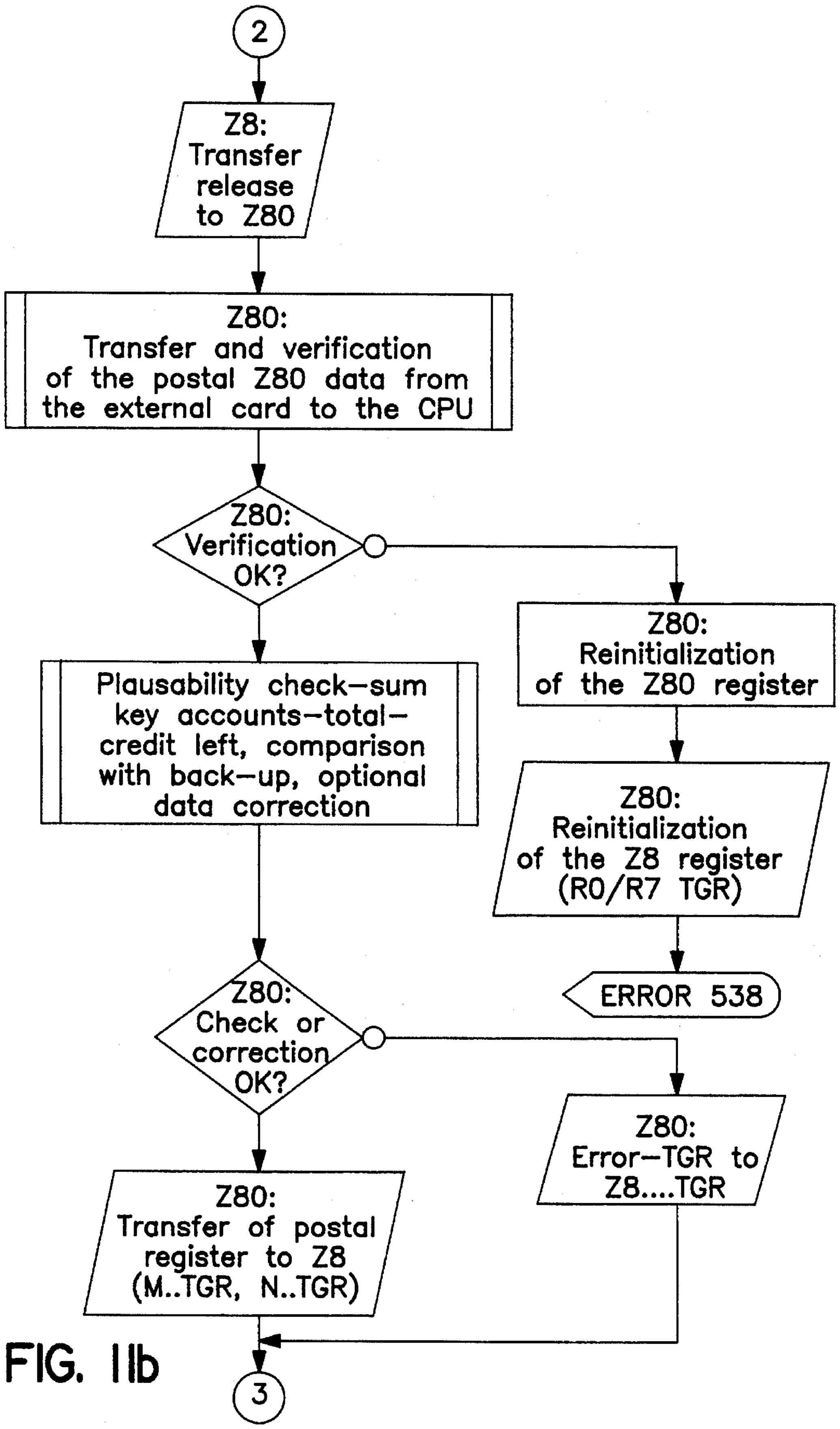
Figure 11C:
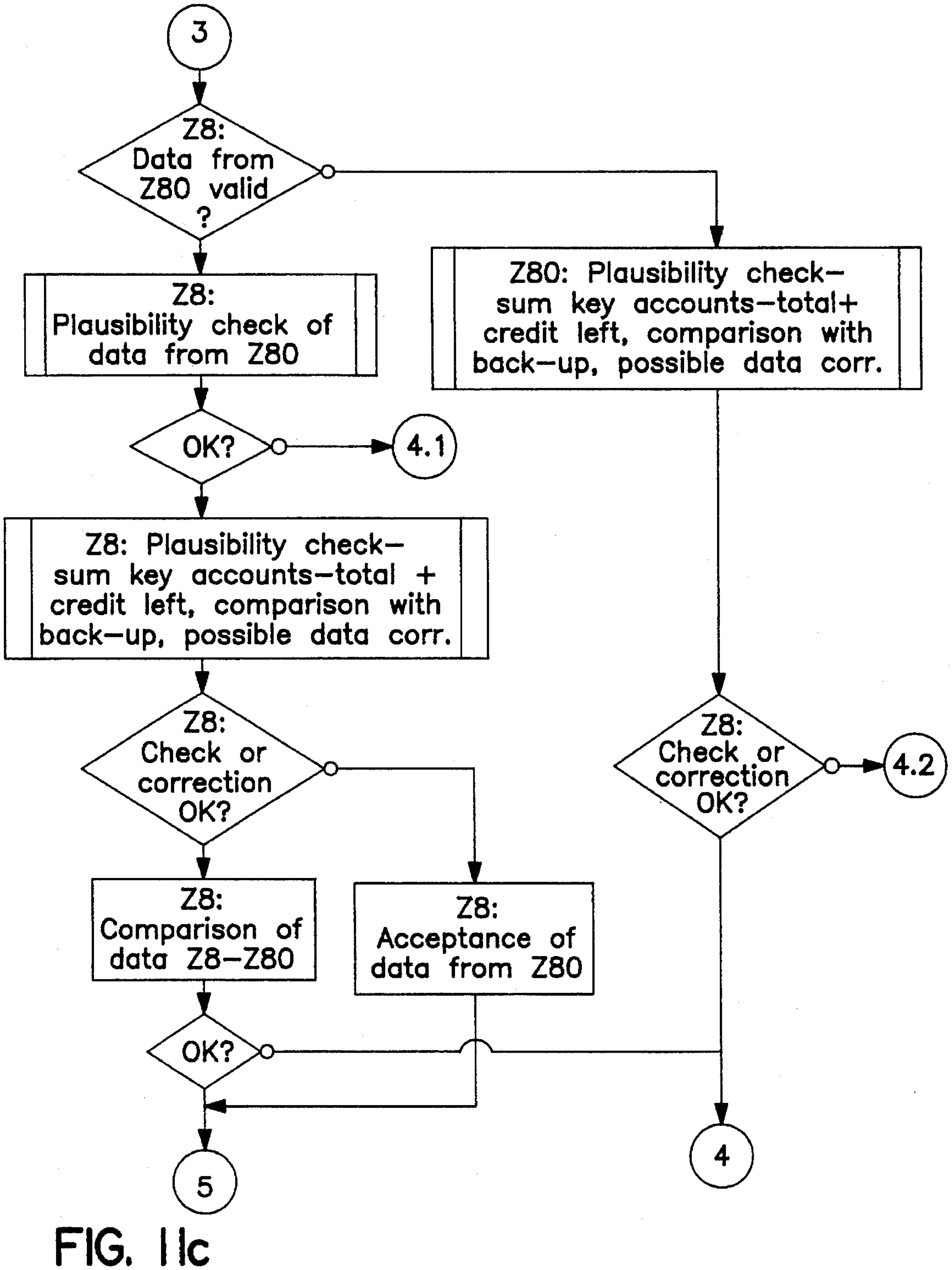
Figure 11D:
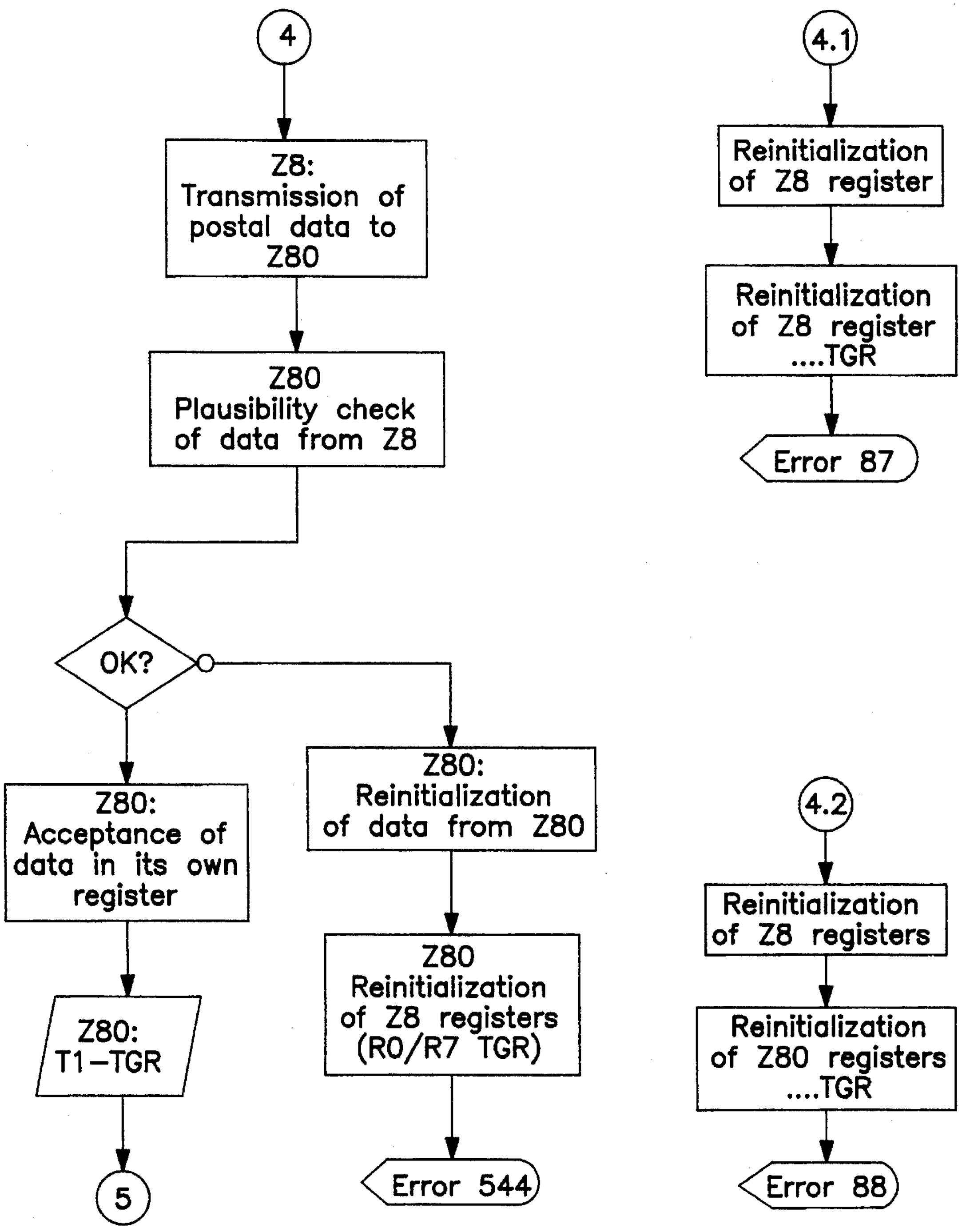
Figure 11E:
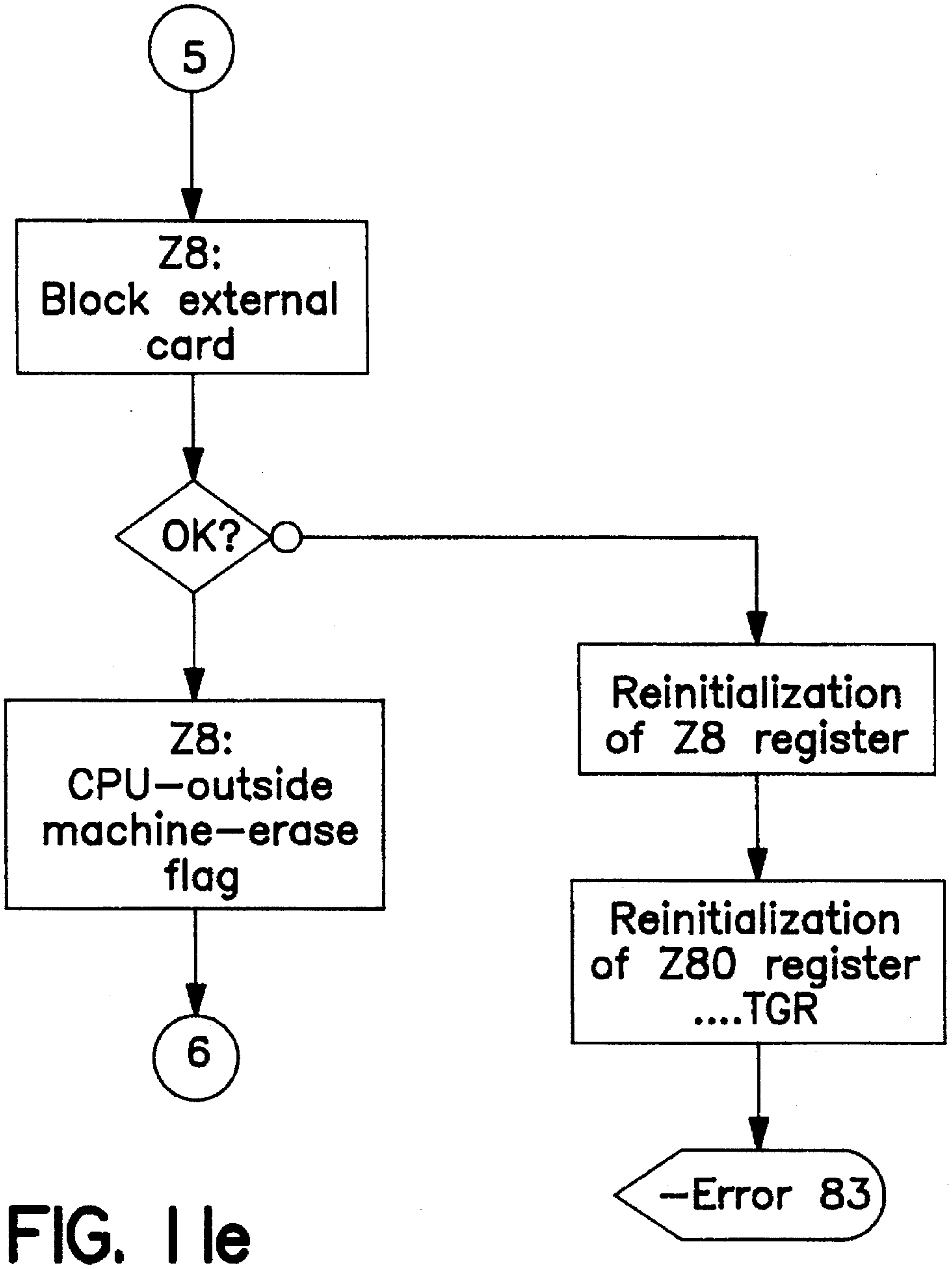
Figure 11F:
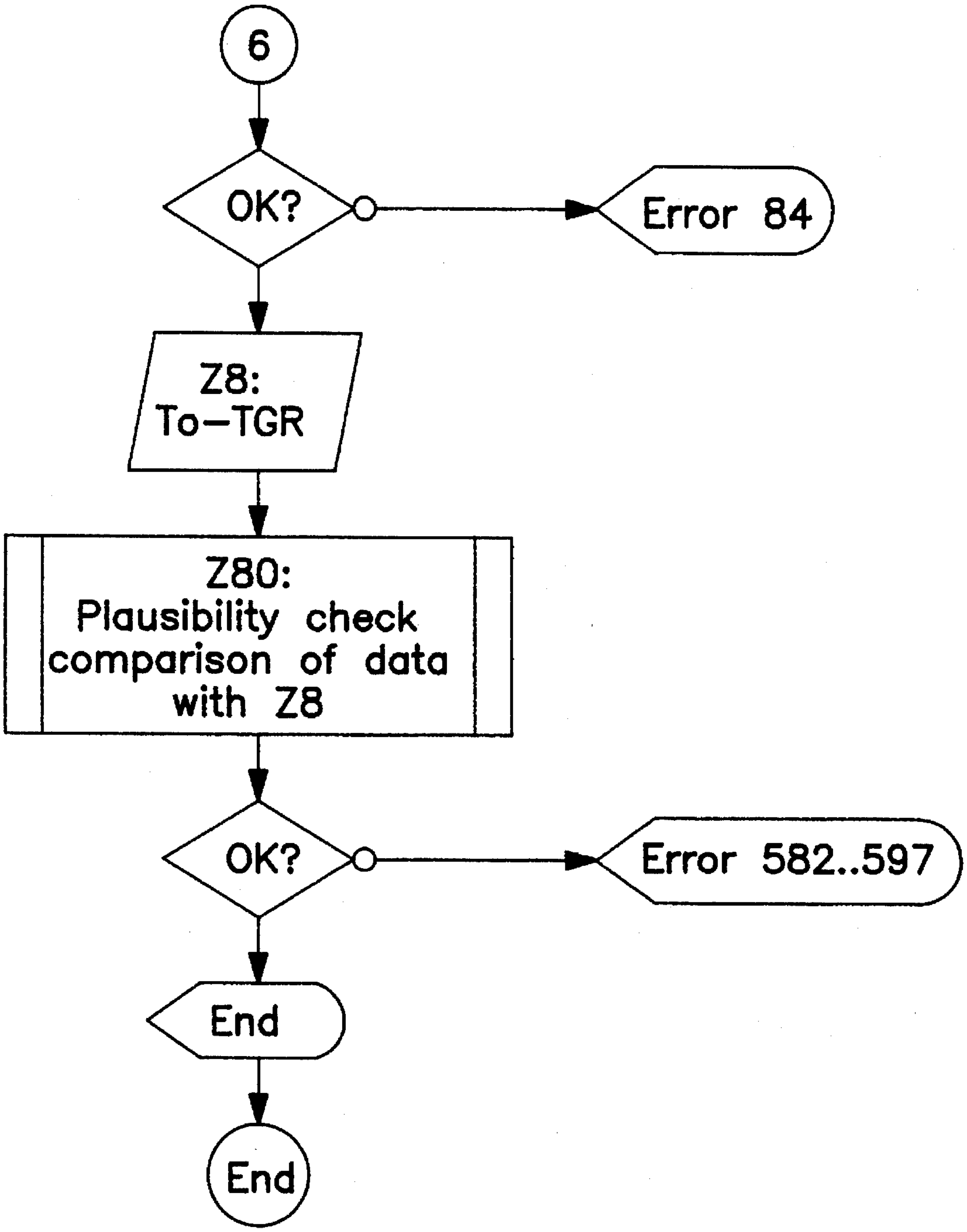

If a fault or error occurs on an electronic element connected to the mounting board 7 in the lead-sealed casing part 4, e.g. due to the failure of a microprocessor or by a short-circuit in the supply, then instead of opening the lead-sealed casing part 4 and replacing or repairing the particular part, the assembly unit 10 constituted by the mounting board 7 and the casing part 4 is merely replaced by a new one. The connector unit 8 is then removed from the old mounting board 7, and the consequently freed counter-plug or mating connector 11 is inserted in a free plug unit 12 (FIGS. 1, 2, 7, and 8) of the new assembly unit 10' provided on the transceiver bus 2. As a result, the CPU 1' of the new assembly unit 10' can read in the data of the memory 3 of the old assembly unit 10. This data flow is indicated by the arrows 14 to 16 in FIG. 10. The data flow during normal operation is indicated in FIG. 9, in which the looping across the connector unit 8 is symbolized by the arrows 17,18.

In order to be able to disassemble from the franking machine the defective assembly unit 10 or a defective electronic component, with the franking machine switched off, it is firstly necessary to remove a locking bolt 20. The latter extends transversely through the casing part 4 and through two wall parts 21,22 of an inner casing frame of the franking machine laterally enclosing the casing part 4. Corresponding passage openings 28 are provided in these parts.

Despite the locking of the assembly unit 10, in order to permit a displacement of assembly unit 10 in its own plane, so that it is possible to bring about a separation of the plug units 24,25,26 which connect to the keyboard subassembly, the power supply subassembly and the interface subassembly of the franking machine without having to disassemble the assembly unit 10 and consequently replace the same, the passage openings for the locking bolts 20 and for two additional guide pins 27 are shaped like a slot 28.

The drawing out of the locking bolt 20 secured by a split pin 30 or a lock washer (not shown) not only brings about the release of the assembly unit 10 for its dismantling, but also, by means of a signalling switch 31 enclosed in the casing part 4, brings about the setting of an electronic flag in two battery-assisted one bit memories (not shown) provided in the assembly unit 10. Thus, this flag indicates that the assembly unit 10 has been disassembled. For this switch operation, the locking bolt 20 has a constriction 34 formed by two conical areas 32, 33 and into which moves the switch button 35 on drawing out the locking bolt 20. Both one bit memories can be read by the CPU and reset. The second memory can also be set by the CPU.

The new assembly unit 10' is installed in the machine in the reverse order, and in it is also set a flag. Following the removal of the connector unit 8, the old, defective assembly unit 10, with its released, lower plug unit 11, is inserted in the plug unit 12' of the new assembly unit 10', so that for this purpose it assumes the vertical position shown in FIG. 8. The franking machine is then connected to power, a special key is inserted in the key receptacle (not shown, but see U.S. Pat. No. 4,788,623 (EP-A-0 214 410)) and a key (DEST) of the keyboard (not shown) of the franking machine is depressed. These instructions start the transfer programme for the data transfer from the old, dismantled assembly unit to the new, fitted assembly unit 10' and this is preceded by a plausibility programme described hereinafter. The flag of the new assembly unit 10' is then erased by its CPU, and in the old defective assembly unit 10 is set a second, non-erasable flag, so that the old assembly unit 10 cannot be improperly used for a second data transfer. The sequence of the transfer programme is displayed on the display .(not shown) by the term "transfer", and at the end of the transfer programme the word "end" appears. The franking machine is then switched off again and the postal rate memory 36 (model PROM) and a code memory 37 (U.S. Ser. No. 07/499,64 (EPA-0 390 731) are removed from the old assembly unit 10 and connected to the new assembly unit 10'. This is possible because they are positioned outside the lead-sealed casing part 4. The old assembly unit 10 is then released again from the new assembly unit 10' and is again provided with its connector unit 8. Power is then again switched on and the franking machine is tested with the machine casing open.

Before the data of the old memory 3 are read into the new memory, various monitoring or plausibility programmes have to be performed in order to ensure that no faulty data can be read in again.

In accordance with a first monitoring programme, it is established which of several data blocks of the memory 3 is erroneous, because for safety reasons the postal data are stored several times at different locations in the memory 3. Thus, the content of all the data blocks is identical in the fault-free state. By summation from the content of different blocks, it is possible according to the monitoring programme to detect the faulty block. In the case of a majority of data blocks with the same data content, it is assumed that these contents are the correct contents and that they can be transferred to the new memory 3.

Should one memory 3 of a CPU completely fail, then no further data can be transmitted, and correspondingly a zero data record is transmitted. For this reason, there are at least two independent microprocessor systems (CPUs) with all the necessary peripherals on the mounting board 7. These CPU's are interconnected in serial manner and they supply the postal data independently of one another. The previously described monitoring programme is performed for all these CPU's.

In accordance with a further monitoring programme, a check is made as to whether the data content of the particular memory of the disassembled mounting board 7 is greater than that of the fitted, new mounting board 7. This ensures that the data content can be inputted to a value amount equal to zero.

FIGS. 11A to F additionally show the programme runs in a programme representation mode. The different function fields mean e.g. start, end, decision, function, complex function and output. Z8 relates to a control computer, whilst Z80 relates to the computer associated with the control and display panel or keyboard. Errors or faults which may occur are figured and appear with said figure and the reading "error" in the keyboard. The error numbers have the following meaning:

Error 80: The counter or register of the new assembly unit 10 does not have the value zero.

Error 81: The flag is not set in the new assembly unit connected for data transfer.

Error 82: The new assembly unit connected for data transfer is blocked for this purpose or does not respond.

Error 2D: Power failure: the motor, code programme or data transfer are to be started.

Error 86: Error detection during checking, data transfer to be repeated.

Error 538: Block error.

Error 87: Transfer error in the postal data from Z80 to Z8.

Error 88: Both memory systems cancelled and the data cannot be retrieved.

Error 544: Transfer error Z8 to Z80.

Error 83: The second blocking flag cannot be set on the old assembly unit 10.

Error 84: The first flag of the disassembled assembly unit 10 cannot be reset.

Error 582..597: Difference Z80–Z8, e.g. in total, in one of the user accounts, etc.

What is claimed is:

1. A microprocessor-memory assembly for use in a franking machine, said assembly being connectable to a replacement unit which comprises an identically constructed microprocessor-memory assembly, said microprocessor-memory assembly comprising:

at least one electronic computer (CPU);

at least one memory for storing postal data containing value amounts;

a common mounting member on which said at least one CPU and said at least one memory are commonly mounted;

a sealed casing part mounted on said common mounting member and housing said at least one CPU and said at least one memory;

first and second connectors provided on said common mounting member, outside said sealed casing part, for connecting said microprocessor-memory assembly to a replacement unit, and for transferring data from said at least one memory of said microprocessor-memory assembly to at least one memory of a connected replacement unit;

a writing line, said at least one CPU being connected to said at least one memory across said writing line for writing working data into said at least one memory;

a looping connector; and a separate transceiver bus in communication with said first and second connectors, the first of said connectors not connected to a mating connector during normal operation of said microprocessor-memory assembly, said second connector being connected with said looping connector, such that data is transferred between said at least one CPU and said at least one memory across said second connector, such data being routed off and then looped back on said second connector through said looping connector.

2. The assembly as claimed in claim 1, wherein said at least one memory is spatially subdivided into several identical data blocks, each of which stores the same postal data.

3. The assembly as claimed in claim 1, wherein, for data transfer from a memory of a defective microprocessor-memory assembly to that of a replacement unit, a CPU of the replacement unit, when being used as a replacement microprocessor-memory assembly, is programmed to check the condition that the postal data content of the memory of said assembly is greater than that of the corresponding, replaced, new memory of said replacement unit.

4. The assembly as claimed in claim 1, comprising:

a releasable locking element; and a battery-assisted memory and a signalling device enclosed in said sealed casing; wherein the assembly, with the sealed casing part, is mechanically secured on an inner frame of a franking machine by said releasable locking element which is in operative connection with said signalling device, said signalling device supplying a signal setting a first flag, upon unlocking, on said battery-assisted memory enclosed in said sealed casing.

5. The assembly as claimed in claim 4, wherein:

the releasable locking element is a bolt extending through said casing and frame and connected in unreleaseable manner to the franking machine; and the signalling device comprises a switch in contact with the bolt.

6. A microprocessor-memory assembly for use in a franking machine, said assembly being connectable to a replacement unit which comprises an identically constructed microprocessor-memory assembly, said microprocessor-memory assembly comprising:

at least one electronic computer processor (CPU);

at least one memory for storing postal data containing value amounts;

a common mounting member on which said at least one CPU and said at least one memory are commonly mounted;

a sealed casing part mounted on said common mounting member and housing said at least one CPU and said at least one memory;

first and second connectors provided on said common mounting member, outside said sealed casing part, for connecting said microprocessor-memory assembly to a replacement unit, and for transferring data from said at least one memory of said microprocessor-memory assembly to at lest one memory of a connected replacement unit;

a releasable locking element; and a battery-assisted memory and a signalling device enclosed in said sealed casing; wherein the assembly, with the sealed casing part, is mechanically secured on an inner frame of a franking machine by said releasable locking element which is in operative connection with said signalling device, said signalling device supplying a signal setting a first flag, upon unlocking, on said battery-assisted memory enclosed in said sealed casing; and a CPU of the replacement unit, on ending the data transfer from the memory of the defective assembly to that of the new replacement unit, is programmed to set a second, non-resettable flag, making a second data transfer from said defective assembly impossible.

* * * * *